(12) United States Patent
Johnson

(10) Patent No.: US 8,206,071 B1
(45) Date of Patent: Jun. 26, 2012

(54) CABINET ANCHOR BOLT ASSEMBLY

(75) Inventor: Jeffrey M. Johnson, Palo Alto, CA (US)

(73) Assignee: Facebook, Inc., Menlo Park, CA (US)

( * ) Notice: Subject to any disclaimer, the term of this patent is extended or adjusted under 35 U.S.C. 154(b) by 328 days.

(21) Appl. No.: 12/496,589

(22) Filed: Jul. 1, 2009

(51) Int. Cl.
*F16B 35/02* (2006.01)

(52) U.S. Cl. ........................................ 411/383; 411/178

(58) Field of Classification Search ................. 411/383, 411/384, 388, 389, 178, 400, 401, 546, 427; 312/223.1, 351.1, 102; 248/551, 552, 500; 52/293.3, 698, 713
See application file for complete search history.

(56) References Cited

U.S. PATENT DOCUMENTS

| | | | | |
|---|---|---|---|---|
| 1,194,792 A * | 8/1916 | Stewart | ........................... | 411/338 |
| 2,631,633 A * | 3/1953 | Peckham | ...................... | 411/134 |
| 3,180,386 A * | 4/1965 | Bynum | ............................ | 411/178 |
| 4,373,309 A * | 2/1983 | Lutz | ................................. | 52/182 |
| 4,987,708 A * | 1/1991 | Wilcox | ......................... | 52/126.6 |
| 6,134,858 A * | 10/2000 | Gutelius et al. | .................. | 52/698 |
| 6,439,817 B1 * | 8/2002 | Reed | .............................. | 411/110 |
| 6,511,282 B2 * | 1/2003 | Notohardjono et al. | ...... | 414/800 |
| 6,634,615 B1 * | 10/2003 | Bick et al. | ...................... | 248/499 |
| 6,817,687 B1 * | 11/2004 | Neeld et al. | ................. | 312/351.1 |
| 2002/0141847 A1 * | 10/2002 | Oh et al. | ........................ | 411/402 |
| 2004/0156697 A1 * | 8/2004 | Bailey | ............................ | 411/384 |

* cited by examiner

*Primary Examiner* — Gary Estremsky
(74) *Attorney, Agent, or Firm* — Fenwick & West LLP

(57) ABSTRACT

An anchor bolt assembly for securing a cabinet and other structures to a sub-floor. A bolt with coaxial upper and lower threaded bores receives a threaded member from above and secures it to a threaded member from below. The upper threaded bore allows the cabinet to be secured to the upper floor. The lower threaded bore provides a securing means for the anchor bolt and its attachments through coupling the threaded bolt from the upper threaded bore to a threaded member protruding from the sub-floor. This threaded member engages the lower threaded bore. The threaded bores of the bolt provide two areas of stabilization against shear and torsional stresses along the axis of the anchor bolt assembly.

11 Claims, 4 Drawing Sheets

CABINET ANCHOR BOLT ASSEMBLY

FIELD OF THE INVENTION

The present invention relates to anchoring devices for equipment cabinets, and more particularly to devices for server cabinets to an upper floor and subfloor.

BACKGROUND OF THE INVENTION

Movable server cabinets are used by information technology companies to store computers, servers, monitors, network equipment and other electronics. Server farms contain many hundreds or even thousands of such movable server cabinets. Once in place, cabinets must be immobilized to prevent unintended shifting or rolling, as well as damage that may occur in the event of earthquakes or tremors. In certain installations, the server cabinets roll along an upper floor spaced apart from a sub-floor by a plenum where cabling and cooling means are stowed. Because of this arrangement, it is difficult to secure the cabinet to the sub-floor. Cabinets are usually only indirectly attached to the sub-floor through some indirect coupling between cross-bars.

Customarily, securing a server cabinet is a time consuming process. The server cabinet is first rolled or moved into place. Then, each of the four legs of the cabinet are bolted through the upper floor by a long threaded rod into an anchor in the subfloor. This approach is time consuming and difficult. In particular, securing the cabinet to the subfloor typically requires access to the subfloor after the cabinet is positioned on the upper floor, thereby necessitating removal of the upper floor panels. The installer must then manually guide a threaded rod through a mount on the cabinet base, through the upper floor and into an anchor on the subfloor, repeating this procedure four times (once for each corner of the cabinet). This approach is both laborious and costly, with the installation process taking about 30 minutes to 1 hour per server cabinet. A large server installation may have hundreds of such cabinets in just a single server room. As such, the current methods retard the rapid mobilization of server installations and impose architectural constraints on the localization of the server cabinets.

SUMMARY OF THE INVENTION

In one embodiment, the present invention comprises an anchor bolt assembly that is preinstalled in the upper floor and secured to the subfloor prior to the locating of the server cabinet. For an individual cabinet, four such anchor bolt assemblies can be preinstalled in the floor. The server cabinet can then be moved into position, and bolted directly to the anchor bolt assembly, eliminating the need to access the subfloor during installation. The installation for a given cabinet can be completed in a matter of minutes.

In one embodiment, the anchor bolt assembly includes an anchor bolt that features a narrow threaded upper bore extending through the bolt proximal to the bolt head and a broader threaded lower bore extending through the opposite end. The bolt is threaded on the outside as well. At a preselected floor site, a suitably sized hole through the upper floor receives the anchor bolt, leaving the head of the anchor bolt and the upper bore exposed. A backing plate slides up along the shaft of the anchor bolt until it comes into abutment with the underside of the upper floor. The anchor bolt and backing plate are then secured to the upper floor by a nut over the outer threading. Within the subfloor an anchor means is installed as well. The anchor means is secured to the anchor bolt by a threaded rod that threads into the lower threaded bore. Once the anchor bolt is secured via the threaded rod to the anchor means in the subfloor, no further access to the subfloor is necessary for installation of the server cabinet.

The server cabinet is then positioned over an anchor bolt assembly. The base of the server cabinet accommodates a threaded bolt that extends from the underside of its base and is threaded into the upper bore of the anchor bolt, completing the installation. If necessary, the threaded bolt can be disengaged from the anchor bolt and the server cabinet can be rapidly relocated.

As can be appreciated, in a given server installation, a large number of the anchor bolt assemblies can be preinstalled in the upper floor prior to final installation of the server cabinets. As such, this takes installation of the anchor bolt assemblies—and thereby the access to the subfloor—out of the critical path for final installation. For example, 400 anchor bolt assemblies can be installed in a server room in anticipation of a subsequent installation of the server cabinets. The installation of the server cabinets can then proceed rapidly at any later point.

Because the anchor bolt can receive threaded members into both its upper and lower threaded bores, it provides a means for coupling a threaded member penetrating the upper floor with a second threaded member protruding from the subfloor. To accomplish this, the threaded upper bore threadingly engages a threaded bolt from the server cabinet while the threaded lower bore threadingly engages a pre-placed threaded rod protruding from the sub-floor.

The features and advantages described in this summary and the following detailed description are not all-inclusive. Many additional features and advantages will be apparent to one of ordinary skill in the art in view of the drawings, specification, and claims hereof.

The figures depict a preferred embodiment of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE INVENTION

The following description and figures relate to various embodiments of the present invention by way of illustration only. One skilled in the art will readily recognize from the following discussion that alternative embodiments of the structures and methods illustrated herein may be employed without departing from the principles of the invention described herein.

Figure 1:
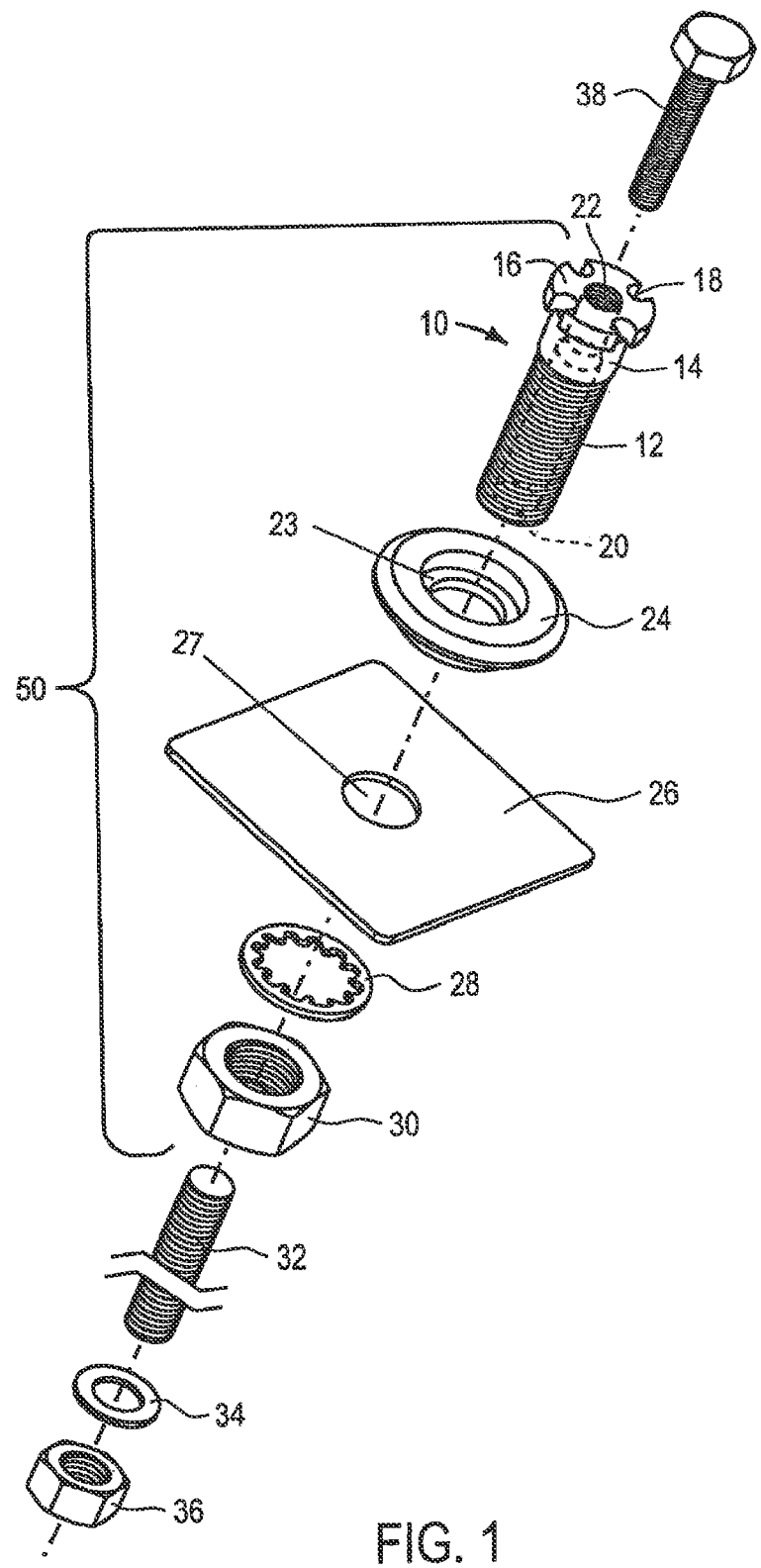
FIG. 1 is an exploded isometric view of the anchor bolt assembly along with two anchoring elements: the threaded mating bolt and a pre-placed threaded bore.
Figure 2:
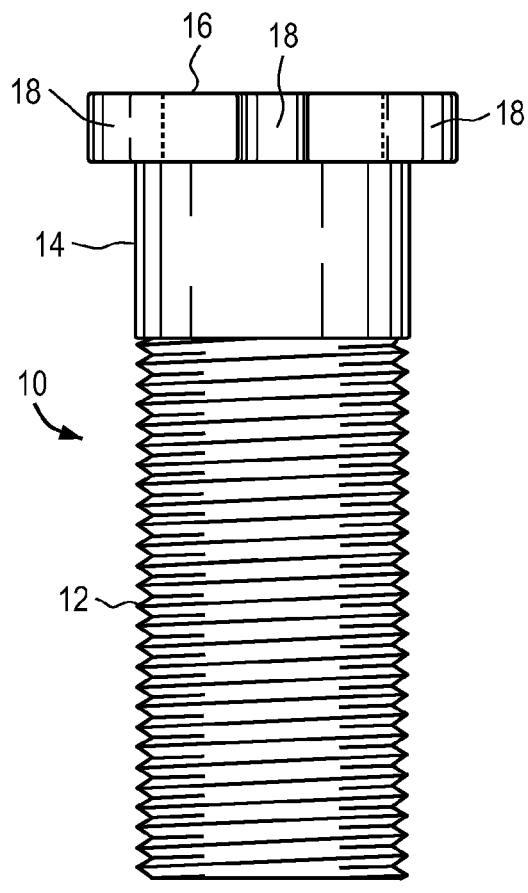
FIG. 2 is a schematic elevational view of the anchor bolt according to the invention.
Figure 3:
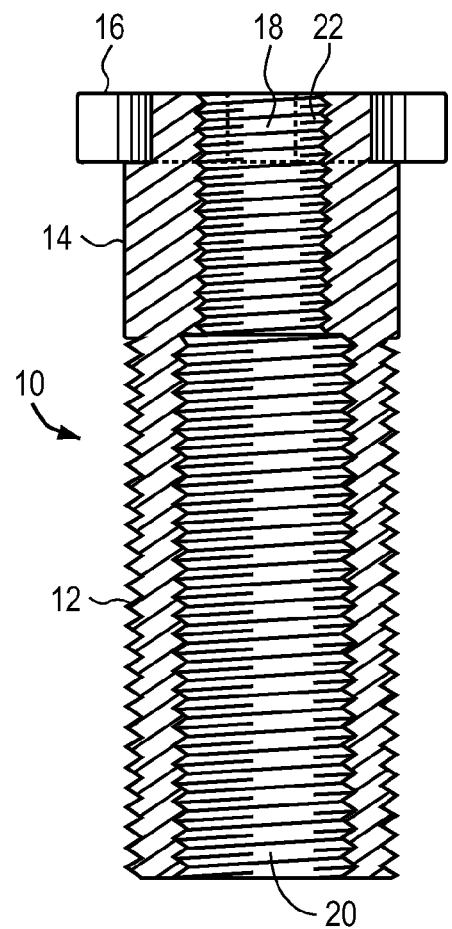
FIG. 3 is a sectional side view of the anchor bolt.

Referring now to FIGS. 1, 2 and 3, one embodiment of an anchor bolt assembly 50 is shown. The assembly 50 comprises an anchor bolt 10 with bolt head 16, a smooth cylindrical leveler shaft 14 extending from below the head 16 to external threads 12. As shown in FIG. 3, a narrow upper bore 22 extends along a central axis of the bolt 10 from the bolt head 16 down through the body of the bolt. A larger inner threaded lower bore 20, extends along the central axis as well of the anchor bolt 10 from its most distal end. In one embodiment the bolt 10 has an outer diameter of 1", the upper bore 22 has a diameter of ½", and the lower bore 20 has a diameter of ⅝". In the illustrated embodiment, the upper bore 22 and the lower bore 20 are coupled together, so that the body of the bolt 10 is hollow. In another embodiment, the bores 20, 22 are not coupled together, there remaining a solid portion of the body in between the inner ends of the bores. While there is no preferred ratio for the diameter of bore 20 to bore 22, compliance with seismic rating standards in geologically sensitive regions may require that the lower bore 20 have a diameter in excess of the upper bore 22. In other embodiments, the bores may have the same diameter.

Referring again to FIG. 1, the anchor bolt 10 sits flush inside a trim ring 24 that annularly surrounds anchor bolt head 16 and thereby extends the effective area of the anchor bolt assembly 50 contacting the surface of the upper floor 62 (FIG. 6) into which it is placed. The anchor bolt 10 rests on an annular surface 23 of the trim ring 24 which provides a smooth bearing surface for the anchor bolt head 16. The annular surface 23 of the trim ring 24 also flanges into a broader generally conical frustum circumambient to the space where the anchor bolt head 16 rests. In this embodiment, the base of the trim ring 24 has an inner circumference that allows it to coaxially contact the shaft 14 without a significant annular gap and the conical frustum has an inner radius that allows it to coaxially contact the anchor bolt head 16 also without a significant annular gap. The coaxial contacting elements provide lateral support for the anchor bolt head 16 and leveler shaft 14 against shear forces in the floor or transmitted through vibrations of the server cabinet.

Figure 6:
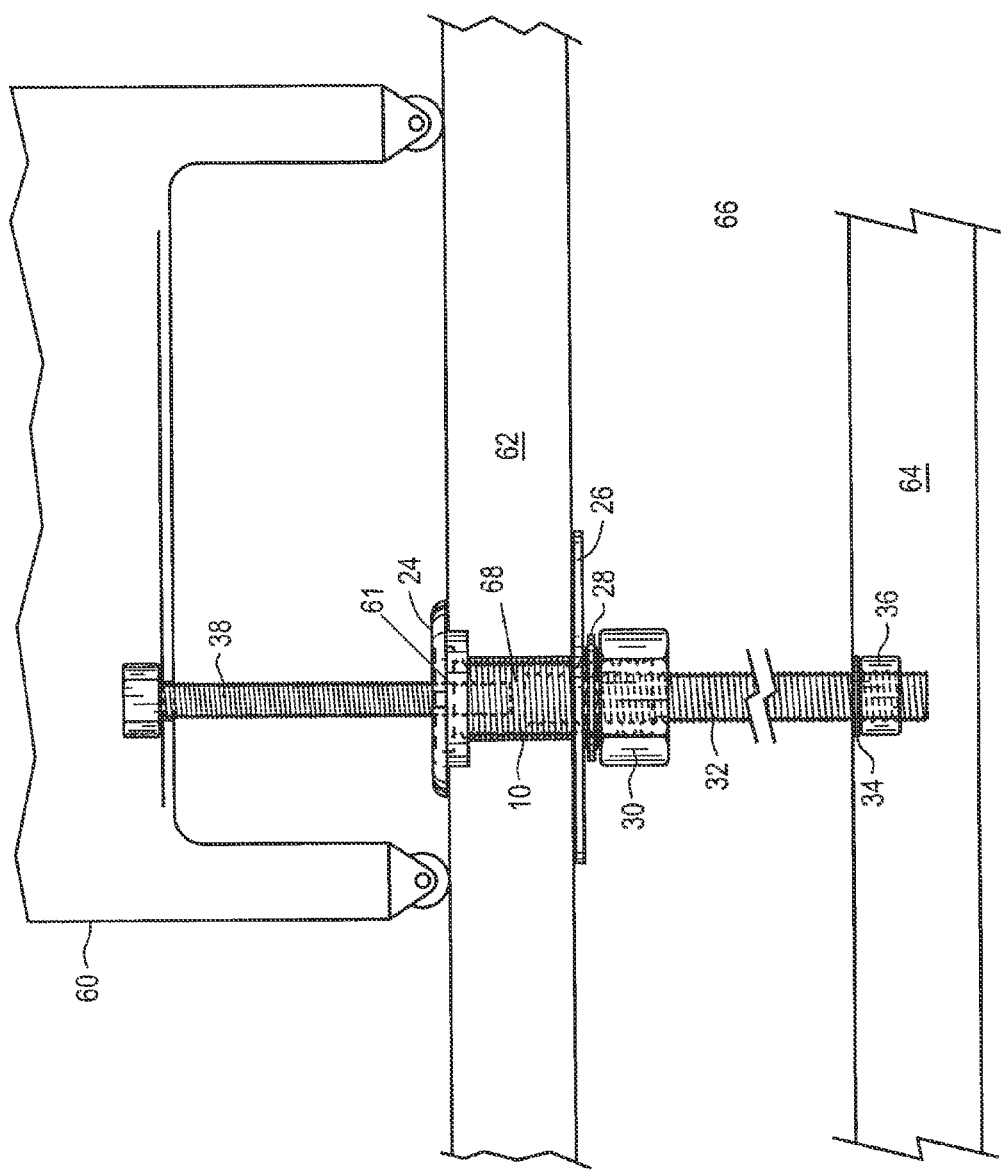
FIG. 6 is a side view of a server cabinet positioned on its casters over an anchor bolt assembly mated to a subfloor threaded bolt.

As shown in FIG. 6, the top surface of the trim ring 24 is co-planar with and extends the top surface of the anchor bolt assembly 50 contacting the surface of the upper floor 62, it provides a customizable means for resisting tensile stresses on the anchor bolt head 16. In alternative embodiments, the conical frustum of the trim ring may have a larger or smaller outer circumference depending on spatial constraints and the seismic standards for a particular location. Similarly, alternative embodiments may increase or decrease the outer circumference of the cylindrical base.

In one embodiment, a backing plate 26 with a central hole 27 (FIG. 1) receives the anchor bolt 10 and secures it against the underside of the upper floor 62 using an internally toothed lock washer 28 that both acts as a bearing surface for nut 30 and also as a bidirectional gripping surface between the backing plate 26 and locking nut 30. This function allows variable and vibrating loads to be accommodated as the internally toothed lock washer 28 will expand and compress as necessary. Locking nut 30 is tightened against the backing plate 26, thereby firmly securing the assembly 50 to the upper floor 62. One end of threaded rod 32 engagingly threads into the lower bore 20 of anchor bolt 10; the other end of threaded rod 32 threads through flat washer 34 into nut 36 (or equivalent anchor means) to secure the threaded rod 32 to the sub-floor 64.

Figure 4:
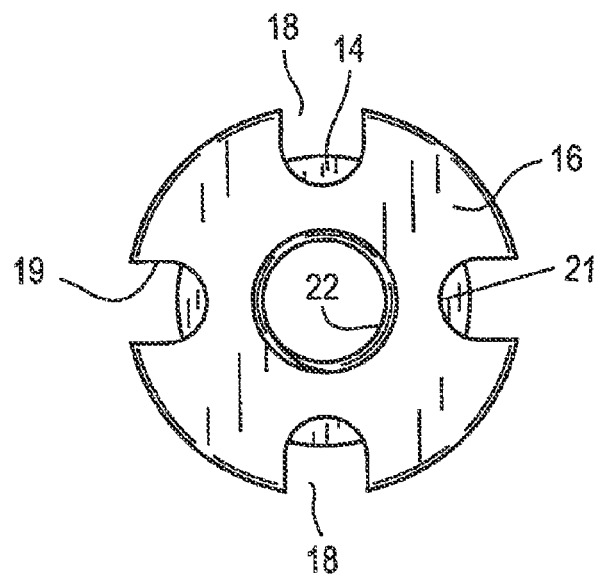
FIG. 4 is a top plan view of the anchor bolt.
Figure 5:
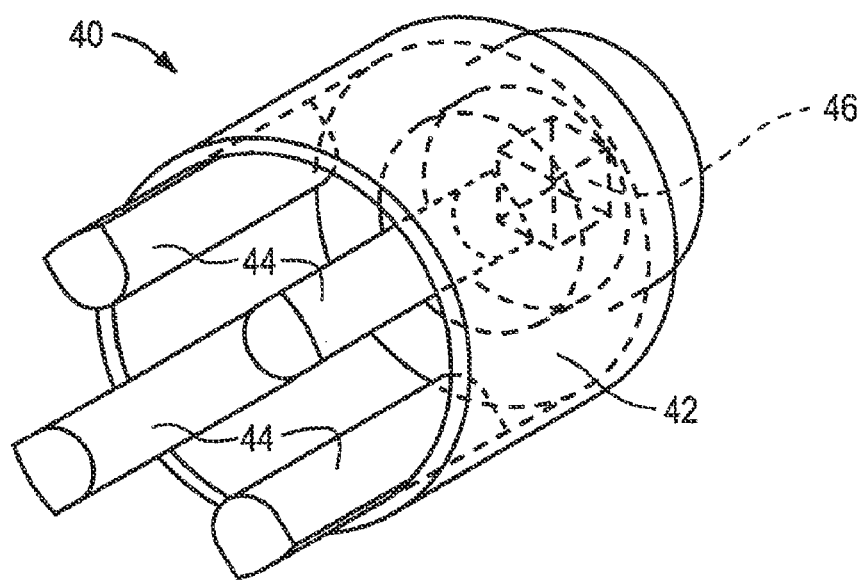
FIG. 5 is an isometric perspective view of the driver for the anchor bolt.

Referring now to FIG. 4 and FIG. 5, in one embodiment the anchor bolt head 16 comprises four U-shaped intrusions 18 equidistantly spaced along its outer periphery. Each U-shaped intrusion 18 extends radially into the head 16, with parallel sides 19 culminating in a semi-circular arc 21, although other embodiments may employ a catenary arc or parabolic arc for added strength against deformation due to shear strain during torquing. In this embodiment, the intrusions 18 allow the anchor bolt head 16 to be externally driven without covering upper bore 22 in the bolt head 16. Furthermore, the otherwise circular shape of the anchor bolt head 16 has the advantage that it provides a load-bearing surface in every direction of deformation within the circular trim ring 24 (FIG. 1). The semi-circular arc 21 of the U-shaped intrusion 18 extends radially toward the upper bore 22 while preferably maintaining approximately ¼" distance between its most internally situated point and the perimeter of the upper bore 22.

Referring to FIG. 5, to drive the bolt head 16 an external driving socket 40 capable of mating with a plurality of U-shaped intrusions 18 is used. The socket 40 has a reinforcing annular body 42 proximal to the square shaped attachment site 46 for driving ratchet, such as a ½" socket wrench (not shown). The body 42 has an open end portion, containing members 44 extending longitudinally from the body 42, which mate with corresponding intrusions 18 to act as a torque transfer means. The members 44 have a U-shaped profile that protrude inwardly from an inner surface of the body 42, and which match the U-shaped intrusions 18 on the anchor bolt head 16. To prevent deformation due to torsional stress on the protruding members 44 the length of each member 44 is approximately equally the thickness of the bolt head 16, so that the members 44 engage entirely with the intrusion 18, even when the bolt head 16 is fully recessed within a trim ring 24 as shown in FIG. 6. In alternative embodiments, the anchor bolt head 16 may employ different shapes (oblong, square, etc.), or numbers, of intrusions 18 so long as they intrude inwardly from the perimeter of the bolt head 16, and receive protruding members 44 complementary, or not, to these intrusions 18, whilst the bolt head 16 is engaged with trim ring 24.

Referring again to FIG. 6, a floor site in a server room comprises an upper floor 62 and a sub-floor 64 spaced apart by a plenum 66. The site is prepared by installing an anchor means such as flat washer 34 and nut 36 into the sub-floor 62, although other fastening means may be equally adequate or even superior to the pictured means. A threaded rod 32 is threaded into nut 36.

A hole 68 is drilled through the upper floor 62 (which is usually segmented into individual tiles), with a diameter slightly larger that the diameter of the bolt 10. The upper portion of the hole 68 preferably has a countersink portion 61 to receive the base of the trim ring 24, which is then positioned in the hole 68. The flange of the trim ring 24 rests on the surface of the upper floor 62, thereby creating a bearing surface for the anchor bolt 10 and providing customizability in the size of bearing surface. The anchor bolt 10 is positioned into and through the trim ring 24. The bolt 10 has a length sufficient to extend through the depth of the upper floor 62. The backing plate 26 and lock washer 28 are then held in against the sub-floor 62 by locking nut 30. The upper floor 62 tile containing the assembly 50 is then positioned over the threaded rod 32, and the bolt 10 is attached thereto, being tightened down using socket tool 40. Once the bolt 10 is securely tightened to the threaded rod 32, the locking nut 30 is finally tightened. This process is repeated for any number of anchor bolt assemblies 50 that need to be installed for a cabinet or server room.

A movable server cabinet 60 is rolled along casters on upper floor 62 until it is positioned over the anchor bolt head 16. The cabinet 60 has a mounting portion through which a threaded bolt 38 passes, and then threadingly engages with the upper bore 22 of anchor bolt 10. The bolt 38 is then securely tightened into the anchor bolt 10, securing the cabinet 60 thereto. (Only a single instance of the anchor bolt assembly 50 and its connection to the cabinet 60 is shown so as not to clutter the drawing; in practice the cabinet 60 will be secured by at least two, typically four such assemblies 50). By having an attachment site in both the upper floor 62 and the sub-floor 64, the effect of forces impinging on the server cabinet 60 and emanating from the floors 62 and 64 are effectively counterbalanced.

It should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

The invention claimed is:

1. An apparatus for securing a cabinet to an upper floor and a sub-floor, comprising:
    an anchor bolt having:
        a cylindrical bolt head with a plurality of intrusions extending inwardly around a periphery, and adapted for torquing the anchor bolt,
        a cylindrical body extending distally from the bolt head, having an outer surface with an unthreaded portion and a partially threaded portion, the unthreaded portion providing a bearing surface for lateral loads placed on the bolt head; the bolt head having a first threaded bore extending coaxially into the body, for receiving a threaded member securing the cabinet to the anchor bolt; and
    the body having a second threaded bore extending from a distal end of the body coaxially into the body for receiving a threaded member securing the anchor bolt to the sub-floor,
    wherein the first bore has a first diameter, the second bore has a second diameter, and the first diameter is less than the second diameter.

2. The apparatus of claim 1, further comprising:
    a trim ring having an annular body to receive therein the anchor bolt, the trim ring adapted to be placed in a hole in the upper floor with the anchor bolt extending through the upper floor;
    a backing plate with a hole capable of receiving the anchor bolt; and
    a nut mating to the threaded portion of the anchor bolt for securing the backing plate against a lower surface of the upper floor.

3. The apparatus of claim 2 further comprising:
    a toothed lock washer disposed between the backing plate and the nut at the lower surface of the upper floor to resist loosening between the backing plate and nut.

4. The apparatus of claim 2, wherein the trim ring comprises an upper annulus that holds the anchor bolt head flush against an inner circumference of the trim ring.

5. The apparatus of claim 1, wherein the first bore and the second bore are coupled together, whereby the body of the anchor bolt is hollow.

6. The apparatus of claim 1, wherein the first bore and second bore are not coupled together through the body of the anchor bolt.

7. The apparatus of claim 1, wherein the first diameter is half of an inch and the second diameter is five-eighths of an inch.

8. The apparatus of claim 1, wherein the intrusions are spaced apart equidistantly around the periphery of the bolt head.

9. The apparatus of claim 8, wherein the intrusions are U-shaped.

10. A server cabinet assembly comprising:
    a sub-floor;
    an upper floor for supporting electrical equipment thereover, the upper floor fixed above the sub-floor to create a space therebetween;
    a threaded rod installed in the sub-floor and extending towards the upper floor;
    a cabinet of electrical equipment resting on top of and supported by the upper floor; and
    an anchor bolt comprising:
        a cylindrical bolt head with a plurality of intrusions extending inwardly around a periphery, and adapted for torquing the anchor bolt,
        a cylindrical body extending distally from the bolt head, having an outer surface with an unthreaded portion and a partially threaded portion, the unthreaded portion providing a bearing surface for lateral loads placed on the bolt head,
        the bolt head having a first threaded bore extending coaxially into the body, for receiving a threaded member securing the cabinet to the anchor bolt, and
        the body having a second threaded bore extending from a distal end of the body coaxially into the body for receiving a threaded member securing the anchor bolt to the sub-floor,
    wherein:
        the anchor bolt of the apparatus is secured to the upper floor through an opening in the upper floor,
        the second threaded bore of the anchor bolt receives the threaded rod installed in the sub-floor securing the apparatus to the sub-floor, and
        the first threaded bore receives a threaded member securing the cabinet to the anchor bolt.

11. A method for securing a cabinet of equipment, the method comprising:
    securing an anchor bolt to an upper floor through an opening in the upper floor, wherein the anchor bolt comprises:
        a cylindrical bolt head with a plurality of intrusions extending inwardly around a periphery, and adapted for torquing the anchor bolt,
        a cylindrical body extending distally from the bolt head, having an outer surface with an unthreaded portion and a partially threaded portion, the unthreaded portion providing a bearing surface for lateral loads placed on the bolt head,
        the bolt head having a first threaded bore extending coaxially into the body, for receiving a threaded member securing the cabinet to the anchor bolt, and
        the body having a second threaded bore extending from a distal end of the body coaxially into the body for receiving a threaded member securing the anchor bolt to the sub-floor;
    threading the second threaded bore of the anchor bolt to receive a threaded rod installed in a sub-floor to secure the apparatus to the sub-floor, wherein the upper floor is fixed above the sub-floor to create a space therebetween and the threaded rod is installed in the sub-floor and extends towards the upper floor;
    positioning the cabinet over the assembly; and
    securing the cabinet to the anchor bolt by threading a threaded member coupled to the cabinet into the first threaded bore of the anchor bolt.

* * * * *